United States Patent [19]
Corcelle et al.

[11] 3,965,326
[45] June 22, 1976

[54] WELDING BY ELECTRON BOMBARDMENT

[75] Inventors: François Corcelle, Cergy; Jacques Courjaud, Parthenay, both of France

[73] Assignee: Commissariat a l'Energie Atomique, Paris, France

[22] Filed: Nov. 25, 1974

[21] Appl. No.: 526,813

[30] Foreign Application Priority Data
Nov. 26, 1973  France .............................. 73.41962

[52] U.S. Cl. ..................... 219/121 EB; 219/121 EM
[51] Int. Cl.² .......................................... B23K 15/00
[58] Field of Search ... 219/121 EB, 121 L, 121 LM, 219/69 R, 72; 250/45 F, 491, 492; 98/116; 141/65

[56] References Cited
UNITED STATES PATENTS

| | | | |
|---|---|---|---|
| 3,469,065 | 9/1969 | Schleich et al. | 219/121 EB |
| 3,529,122 | 9/1970 | Hinrichs | 219/121 EB |
| 3,535,487 | 10/1970 | Hinrichs et al. | 219/121 EB |
| 3,585,349 | 6/1971 | Kalbfell | 219/121 EB |
| 3,592,995 | 7/1971 | Hinrichs | 219/121 EB |
| 3,675,072 | 7/1972 | Hahn et al. | 250/457 X |
| 3,731,052 | 5/1973 | Ogawa et al. | 219/121 EB |
| 3,742,365 | 6/1973 | Sciaky | 219/121 EB |

FOREIGN PATENTS OR APPLICATIONS
1,383,226  11/1963  France .......................... 219/121 EB
2,115,870  10/1972  Germany ...................... 219/121 EB Primary Examiner—Arthur T. Grimley
Assistant Examiner—G. R. Peterson
Attorney, Agent, or Firm—Lee C. Robinson, Jr.

[57] ABSTRACT

The present invention relates to improvements in methods and apparatus for welding by electron bombardment, utilizing an electron gun directing an electron beam into a chamber under partial continuous vacuum maintained by continuous pumping. The partial vacuum chamber terminates in a working chamber, and a valve device separates the partial vacuum chamber from the working chamber, the latter being fixed on a support actuated by a displacement device acting in a direction perpendicular to the electron beam. The gun is associated in known manner with a means for maintaining high vacuum and communicating with the partial vacuum chamber through a narrow orifice provided with a closure device, the partial vacuum chamber being associated with individual continuously-acting pumps. The displacement device comprises a first trolley slidably mounted on a second trolley and moving at right angles to the beam, the second trolley being slidably mounted in turn along a direction at right angles to that of the first trolley, on the frame of the machine.

19 Claims, 7 Drawing Figures

WELDING BY ELECTRON BOMBARDMENT

The present invention relates to improvements in welding by electron bombardment, utilizing an electron gun which directs an electron beam into a chamber under partial vacuum, in which the parts to be welded are placed. The heat developed by the electron beam produces a localized fusion of the metal and effects the desired welding.

This method of welding has a certain number of advantages, especially as regards the quality of the weld, but it has the disadvantage of being relatively delicate and time consuming. In fact, during each transition from a welded part to a fresh part to be welded, it is necessary to bring the welding chamber to atmospheric pressure in order to carry out changing of the part, after which pumping is effected in order to obtain the appropriate partial vacuum for the welding operation. This partial vacuum is of the order of $10^{-2}$ torr, and it will be understood that it is necessary to have powerful pumps available in order to permit a suitable rate of production to be maintained. These pumps sets are all the more powerful since they only operate intermittently.

In order to remedy this latter disadvantage, it has been proposed to arrange, between the electron gun and the working chamber, a chamber under continuous partial vacuum. The electron beam passes through the partial vacuum chamber into the working chamber by means of an orifice which is capable of being closed by a valve. In this way, continuous operation of the pumps is ensured, and a very rapid reduction of pressure in the working chamber is achieved by simply opening the valve which separates it from the constant vacuum or buffer-chamber.

In the proposal which has been made, it had even been necessary to ensure, not a changing of parts in one single working chamber, but a change-over of working chambers, the latter being fixed on a supporting means associated with displacement means acting in a direction substantially perpendicular to the electron beam. Thus, during a welding operation on a part placed in a working chamber, it is on the one hand possible to install a part to be welded in another working chamber and to remove a welded part from a third working chamber.

An advantageous method of utilization of this arrangement consists of placing the various working chambers at the periphery of a rotating plate, this periphery being provided opposite the outlet with a buffer chamber, and of ensuring a slight displacement of each chamber thus brought opposite the chamber under constant partial vacuum in order to apply the contour of an opening in coincidence with the outlet of the partial vacuum chamber. The closure valve is then opened, the exhaustion of the working chamber thus brought into position is almost immediately effected, and the welding operation can thus be carried out.

In this type of machine for welding by electron bombardment, the production rates have thus been substantially increased, but the field of application of the machine still remains relatively narrow, however, since it is of course necessary to provide a working chamber which is as small as possible as compared with the buffer-chamber in order to obtain the highest vacuum in a short time.

The result is that changes in the dimensions of a part to be welded often require the changing of all the working chambers provided at the periphery of the rotating plate, which represents a particularly heavy capital cost, and a constantly renewed complexity in the adaptation of the machine to its new application.

The present invention is directed to improvements in machines for welding by electron bombardment which permit the welding of parts of different sizes with as small a number as possible of working chambers, while ensuring a production rate which is particularly effective. According to the invention, the electron gun is associated with means for maintaining continuously a high vacuum, the said electron gun communicating with the continuous high vacuum chamber by a narrow passage orifice for the electron beam. The orifice is provided with a closure device, and the high vacuum chamber is associated with individual pumping means working continuously. The machine also includes means for displacing the working chamber support which is capable of acting in a direction substantially parallel to the electron beam, the displacement means perpendicular to the beam and parallel to the beam being adjustable in any position on their respective paths.

By virtue of this arrangement, there is ensured on the one hand a separate exhaustion of the electron gun and the buffer chamber, and on the other hand, by moving away the working portion of the chamber under continuous high vacuum, it is possible immediately to disconnect the working chamber from its support and to replace it by another working chamber of different size. In addition, by virtue of the fact that the displacements parallel and perpendicular to the beam are adjustable in any position, it is easy to bring the new chamber into a suitable position against the opening of the high vacuum chamber, so that, taking account of the shape of the part to be welded, the portion to be welded is located on the path of the electron beam. It will be understood that it is the whole of the measures described above which enables the desired result to be obtained. In fact, it will be understood that it is only necessary to have a simple displacement parallel to the axis of the beam in order to ensure the disengagement of the working chamber and to substitute another working chamber therefor, but this displacement will not be sufficient to permit the adaptation of a working chamber, of which not only the size is different from that of the previous chamber but also the position of the inlet opening of the electron beam.

It is therefore necessary to associate with this displacement parallel to the axis of the beam a displacement which is perpendicular thereto, and it is furthermore desirable that these two displacements should be perfectly adjustable over the whole length of their travel in order thereby to position the working chamber in space at a suitable point under the continuous depression chamber.

These means of displacement of the support of the working chamber advantageously comprise a first trolley mounted slidably on a second trolley, the said second trolley being in turn slidably mounted in a direction at right angles to the direction of the said first trolley, on the frame of the machine.

It will be understood that the utilization of these displacement means, which are known per se, is particularly simple and enables the desired result to be obtained without difficulty.

According to a preferred form of embodiment, the chamber support is a moving poppet, the working extremity or mandrel of which is adapted to pass in a fluid-tight manner through a wall of the working chamber. In this way, it is only necessary to place the part to be welded on the moving poppet in order to carry out a welding operation.

Another improvement according to the invention is directed to a particular method of construction of the machine. The continuous high vacuum chamber forms with the frame of the machine a supporting bracket for the electron gun, while the working chamber comes into fluid-tight relationship with the continuous vacuum chamber. This construction is especially effective since it makes it possible to free all of the space below the continuous vacuum chamber to effect the movements permitting not only the various operations of loading and unloading, but also the easy adaptation of a new working chamber.

A further improvement of the present invention is directed to an articulated mounting of the chamber support on the first trolley along an articulation axis which is perpendicular to the two directions of movement of the first and second trolleys. By virtue of this arrangement, welding operations can be carried out on a part placed in the working chamber along at least two planes angularly displaced by angular movement of the working chamber support, this movement being effected by withdrawal of the working chamber under continuous low pressure, rotation of the support of the working chamber, and then bringing back the working chamber until it comes into contact with the continuous high vacuum chamber.

Still a further improvement according to the invention relates to a particular method of construction of the valve which is interposed between the continuous high vacuum chamber and a working chamber. The valve has two closure plates intended to be applied elastically against two passage orifices in the valve body, the said closure plates being mounted with sliding movement from a position of opening to a position of closure, and being associated with transfer means effecting an approach movement of the closure plates to each other during the transfer from the opening position to the closure position and vice-versa.

In an advantageous manner, the transfer means comprise a jack and a driving frame with a ramp co-operating with abutments fixed on the plates. This driving frame is provided with abutment fingers co-operating with abutments on the valve casing for the end-of-travel of the closure movement and advantageously for the end-of-travel of the opening.

The characteristic features and advantages of the invention will be brought out in the description which follows below, given by way of example with reference to the accompanying drawings, in which.

Referring now to FIGS. 1 to 4, a machine for welding by electron bombardment comprises an electron gun 1 mounted above a chamber 2 under continuous low pressure, through the intermediary of a displacement device 3, not described in detail and permitting a limited movement of the gun 1 along an upper wall 4 of the low pressure or buffer chamber 2. Below the chamber 2 is fixed a valve 5, against which is supported a working chamber 6. This working chamber 6 communicates, when the valve 5 is open, with the chamber 2. The electron gun 1 is arranged to direct an electron beam 7 (FIG. 4) through the open valve.

Figure 4:
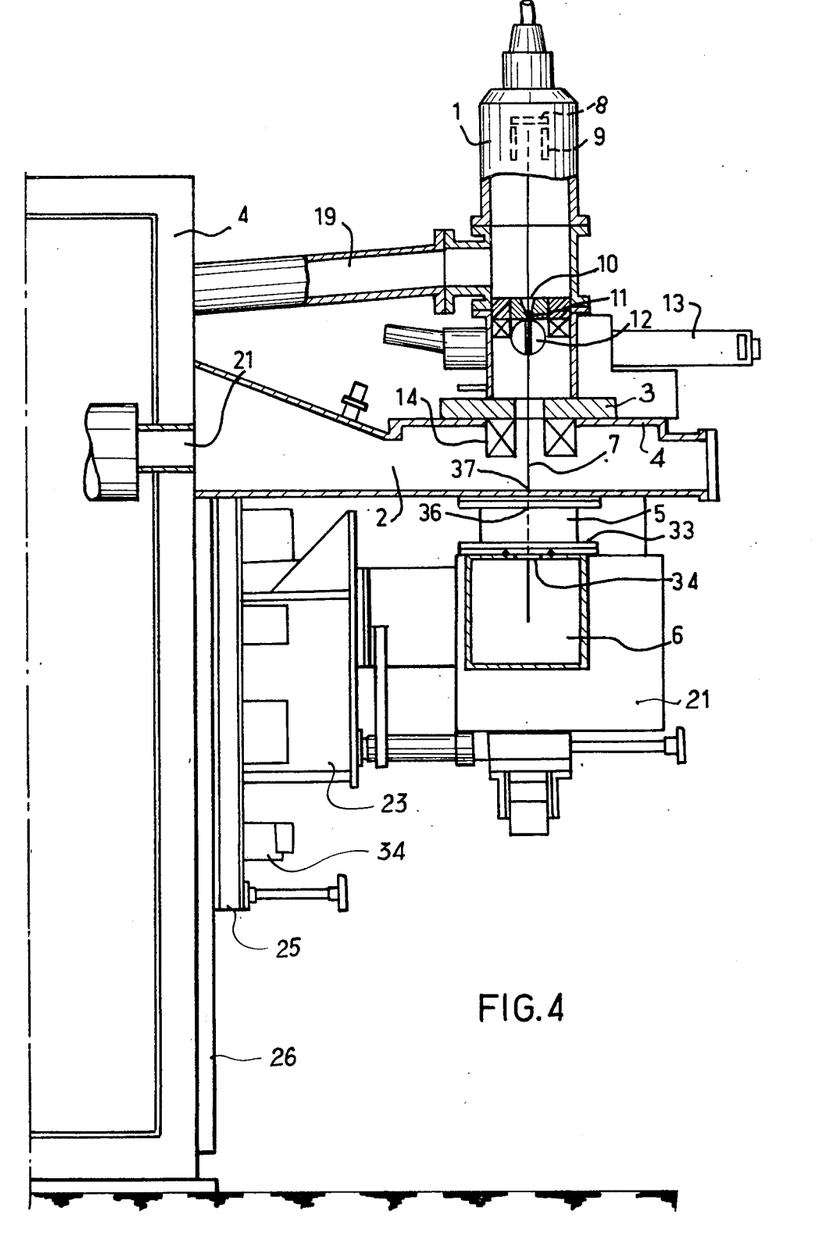
FIG. 4 is a diagrammatic view, similar to that shown in FIG. 1, but in cross-section.

In the usual manner, the generation and emission of the electron beam 7 are ensured by a cathode 8, a Wehnelt electrode 9, an extraction anode 10 also forming a narrow orifice 11 between the continuous low pressure gun chamber 1 and the chamber 2. This orifice 11 may furthermore be formed by a spigot cock 12 associated with optical means permitting the welding operation to be examined by an optical viewing device 13. The electron beam thus issuing from the spigot cock 12 is focussed by focussing coils and, if so required, by deflection coils 14 which are located inside the chamber 2.

The interior of the electron gun is kept at a pressure of the order of $10^{-5}$ torr by means of a diffusion pump and primary pump unit, the whole of which is shown diagrammatically at 15, while the maintenance of a primary vacuum of the order of $10^{-2}$ to $10^{-3}$ torr is ensured in the chamber 2, through the intermediary of a pumping unit associating Roots pump 17 and vane pumps 18.

The working chamber 6 is carried by a moving poppet 20 fixed on a driving unit 21. The driving unit 21 is pivotally mounted along a transverse shaft 22 on a first trolley 23, which slides horizontally by means of rollers 24 on a second trolley 25. This latter trolley in turn slides along rails 26 fixed on a frame 27. The working chamber 6 is traversed in a fluid-tight manner by the mobile poppet 20 in such manner that the parts to be welded, shown at 28, are taken between this mobile poppet and a tail-stock 29 fixed to a door 30 actuated by a jack 31 and a rod system 32.

The frame 27 directly carries the continuously low pressure chamber 2 and forms therewith a kind of bracket serving for the fixing and the support of the electron gun unit 1 and the gun-displacement device 3, together with the associated accessories.

Figure 1:
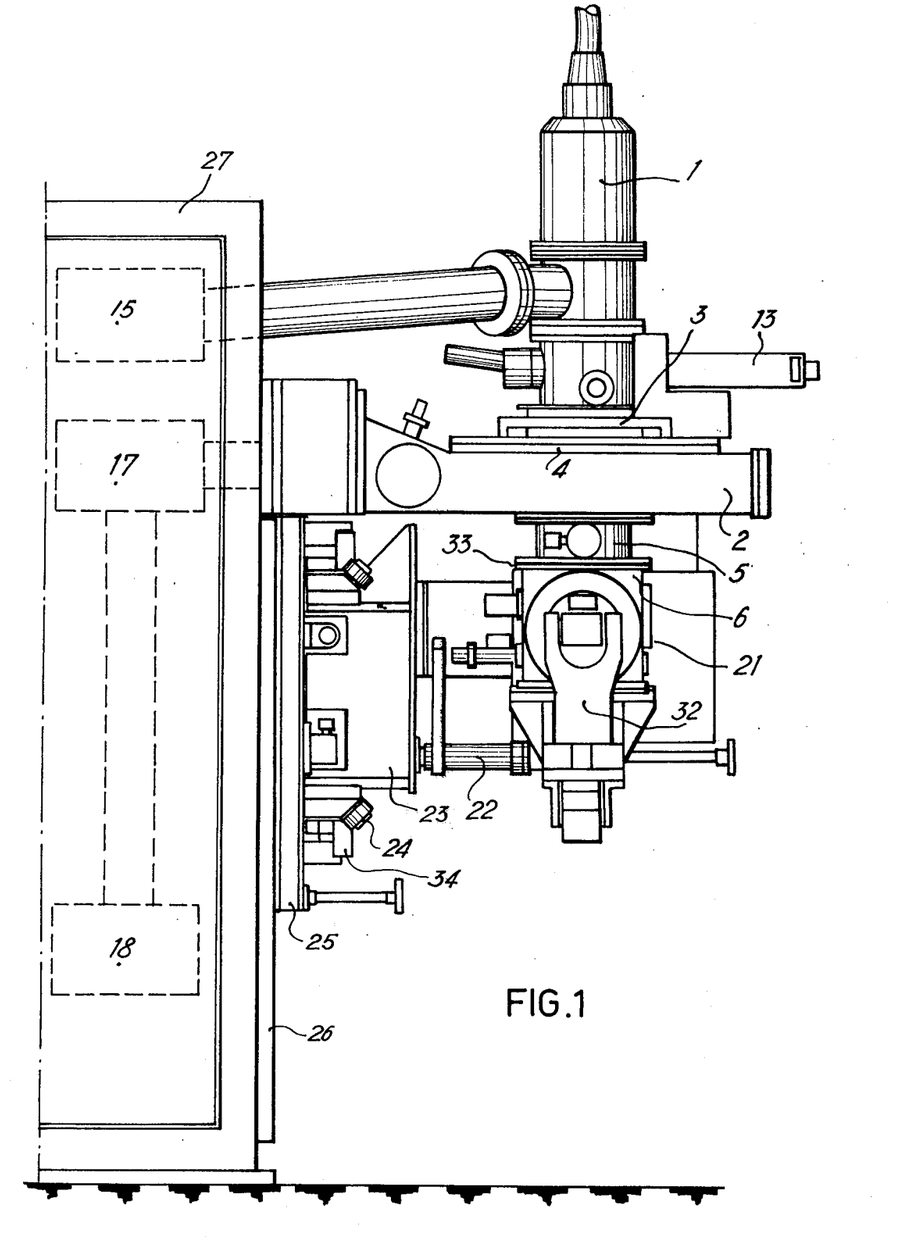
FIG. 1 is a view in side elevation, partly in cross-section of an installation for welding by electron bombardment according to the invention.
Figure 2:
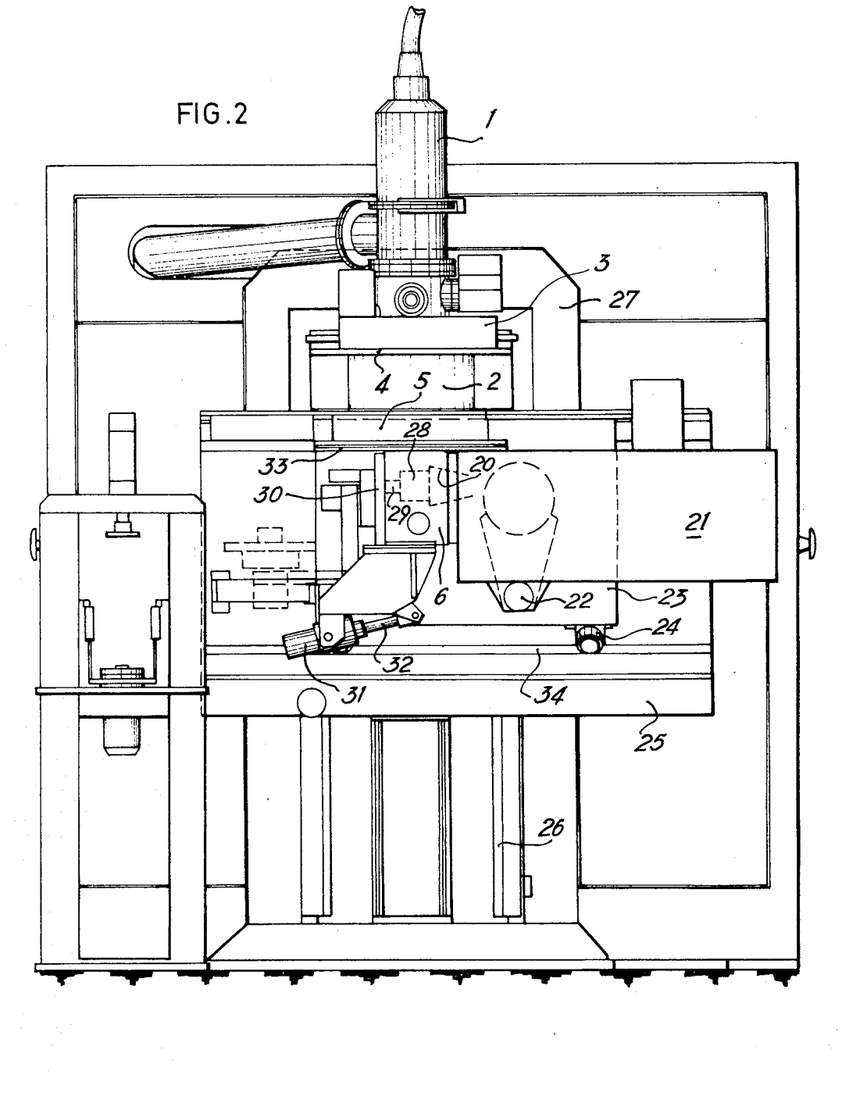
FIG. 2 is a front view in elevation of this same machine.
Figure 3:
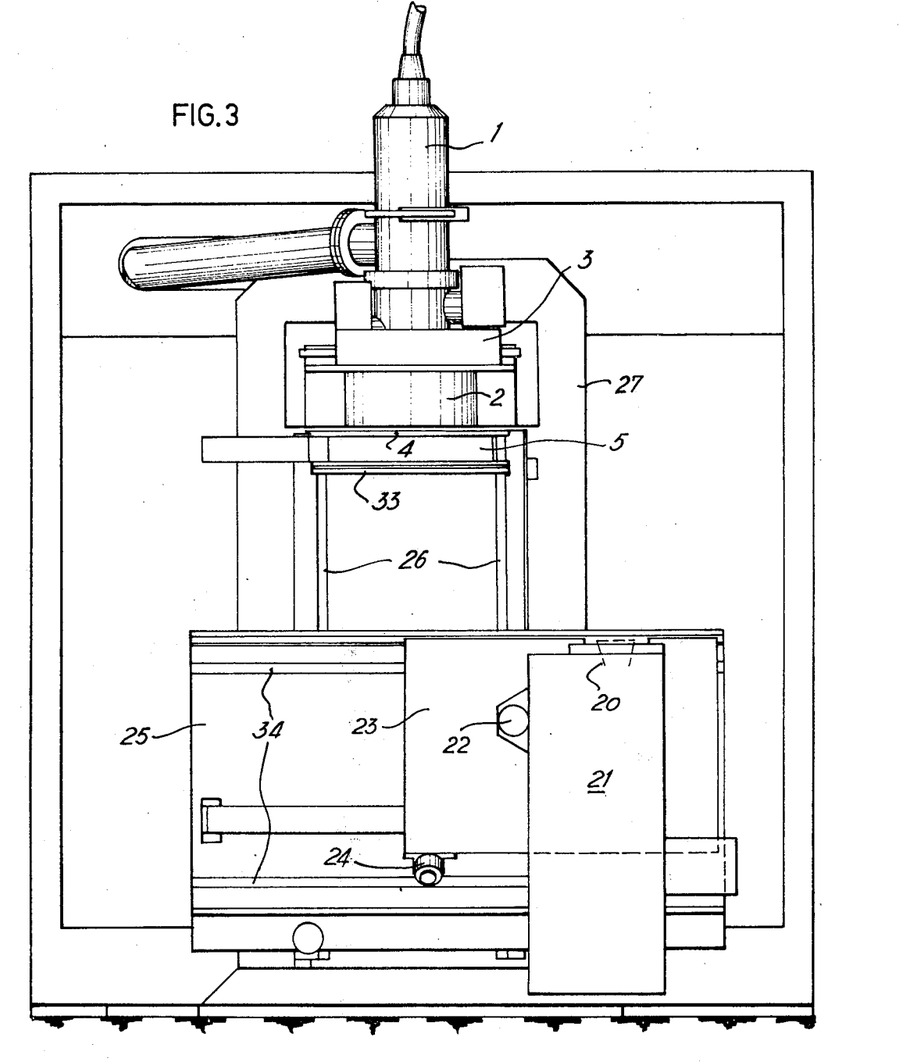
FIG. 3 is a view similar to FIG. 2, but with portions of the machine in another position.

The operation of the machine for welding by electron bombardment is as follows:

Starting for example with FIGS. 2 and 4, it is seen that the welding chamber 6 is in the working position, that is to say applied in a fluid-tight manner against a lower supporting face 33 of the valve body 5. The orifices of the working chamber 6, the valve body 5, and the continuous low pressure chamber 2 are in alignment with the electronic beam 7. The parts to be welded 28 have been previously placed between the mandrel jaws of the poppet 20 and the tail-stock 29 on the door 30.

By automatic means (not shown) the valve 5 is opened which enables a high vacuum to be rapidly established in the working chamber 6, because of its communication with the buffer or continuous high vacuum chamber 2. At the same time, as soon as the pressure of the working chamber 6 has dropped to the correct working value, the spigot cock 12 is put into the open position and the electron gun is actuated so as to emit an electron beam 7 which contacts the parts to be welded at the point of welding. Simultaneously, the mobile poppet 20 is rotated, and when this first weld is completed, if so desired, another weld is effected in another parallel plane of welding by simple movement of the electron gun by means of the displacement device 3, in a direction perpendicular to the plane of FIG. 1.

As soon as the various welding operations are completed, the electron gun is switched off and the valve 5 is closed, following which the door 30 of the working chamber 6 is opened, the welded part is removed and a fresh identical part put in its place.

The machine enables the welding of parts of different shapes and sizes. To this end, the withdrawal of the chamber 6 is carried out, as this is unsuitable for the new part to be welded; the procedure is as follows:

A downward movement of the trolley 25 is effected by sliding it along the rails 26. This enables the working chamber 6 to be removed downwards and ensures its almost immediate removal and replacement by a welding chamber appropriate to the fresh part to be welded. Thereafter, the adjustment of the upper movement of the trolley 25 along the rail 26 and the adjustment in position of the new working chamber 6 is carried out, if so required, by movement of the trolley 23 along the guiding rails 34 on which the rollers 24 are supported.

It will be understood that by virtue of this arrangement of a series of two movements, of which one is established along the direction of the electron beam, that is to say along the rails 26, and the other in a direction which is perpendicular thereto, that is to say along the rails 34, any kind of working chamber can be adapted on the machine.

Another advantage of the invention resides in the articulation of the driving device 21 (FIG. 3) about the shaft 22, which permits of axial welding, that is to say the welding of two rotating parts about an axis parallel to the axis of the electron beam. It is possible in this case to utilize either a specially fitted working chamber or the radial welding chamber as previously described, by closing in a fluid-tight manner, however, the normal welding opening and by applying the door opening against the valve plate.

Figure 5:
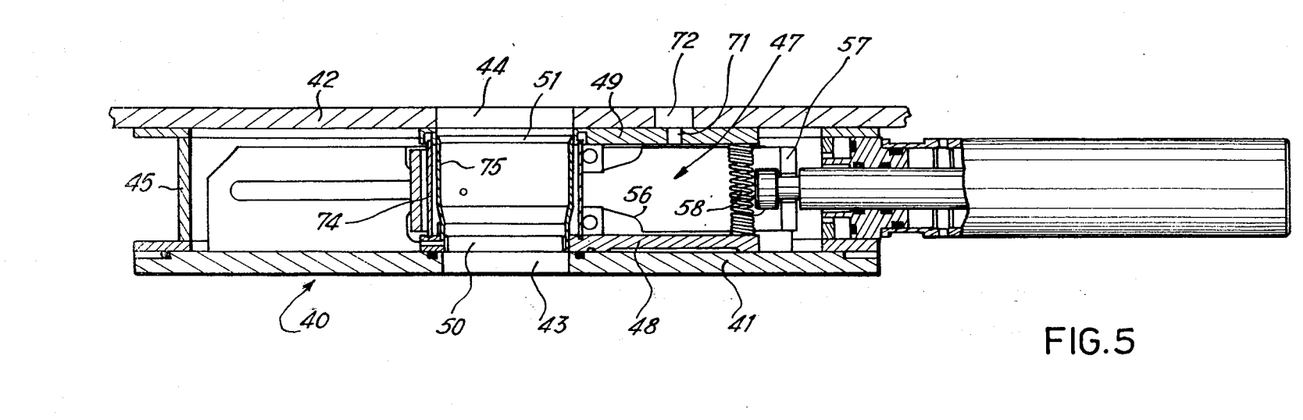
FIG. 5 is a view in longitudinal section of a valve for fitting on the machine according to the invention.
Figure 6:
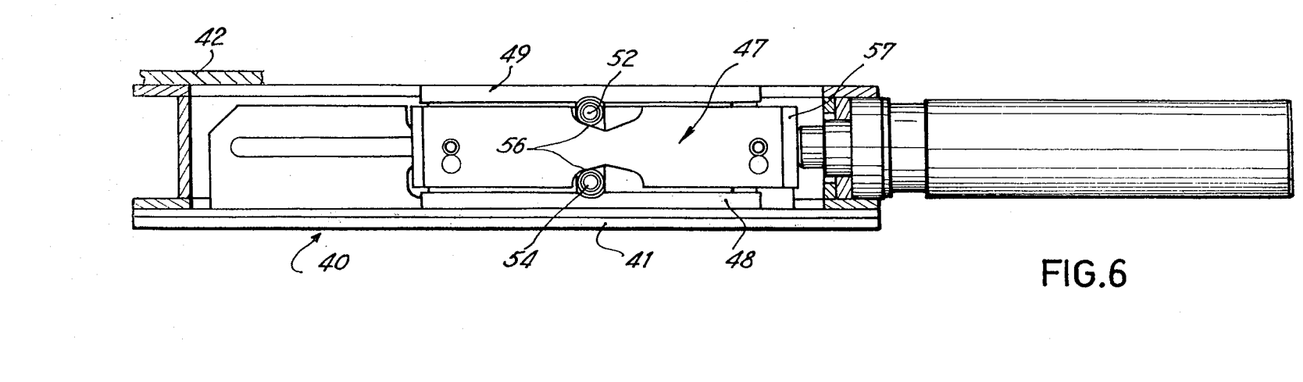
FIG. 6 is a view in elevation, partly in cross-section of this same valve.
Figure 7:
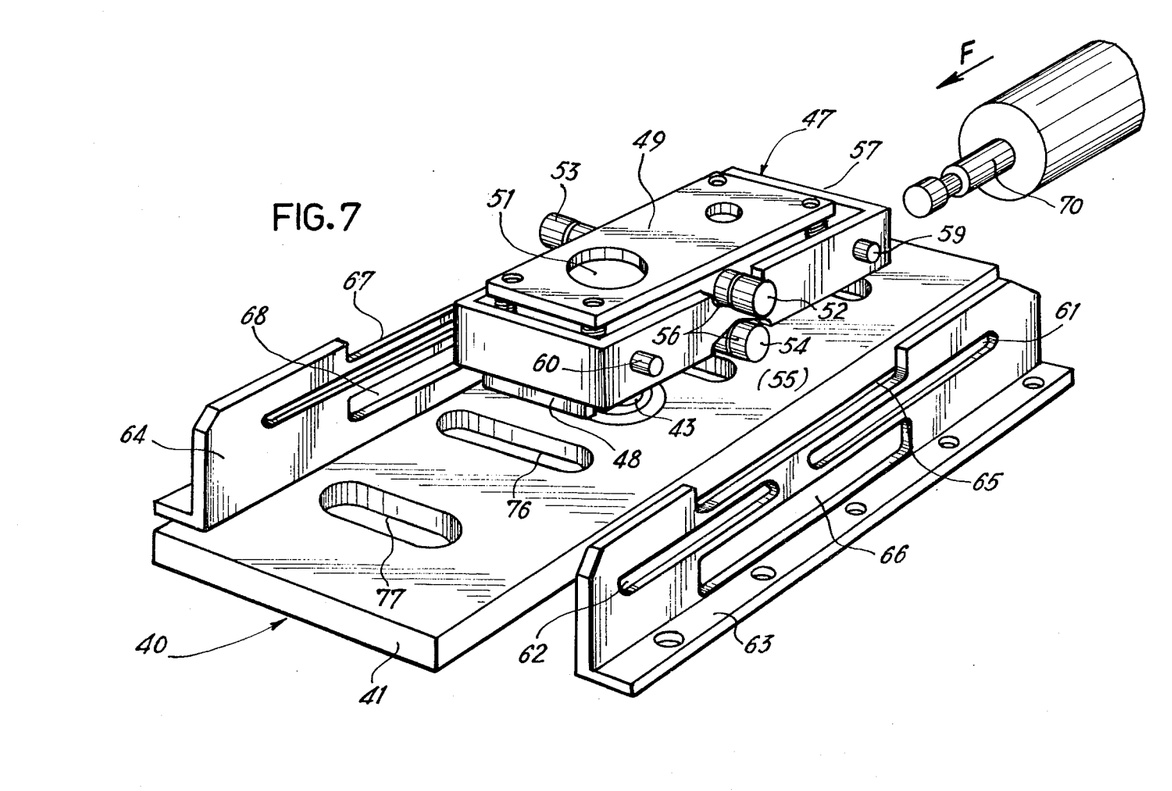
FIG. 7 is a perspective view, partly in cross-section, of this same valve.

The valve 5 which is interposed between the low pressure chamber 2 and the working chamber 5 is of original construction, which is now described in detail with reference to FIGS. 5, 6 and 7.

This valve 5 comprises a flat casing 40 formed between a wall 41 known as the working wall, namely that located on the side of the working chamber 6, and a so-called low pressure wall 42 which is located on the side of the low pressure chamber 42, both these walls 41 and 42 having wide passages 43, 44 respectively. The two walls are joined to each other by a flanged lateral wall 45. It will further be noted that in a simplified form of construction, at least one of the walls, for example the so-called low pressure wall 42, may simply be constituted by part of the wall of the low pressure chamber.

Inside the casing 41 slides a moving system 47 constituted by two closure plates 48 and 49, each comprising an orifice 50, 51 respectively and each having a pair of fingers or lateral abutments 52, 53, and 54, 55 respectively. These lateral fingers are engaged in slots in the form of ramps 56 formed in a driving frame 57, the plates 48 and 49 being subjected to a return force caused by four tension springs 58.

The driving frame 57 is provided with lateral nipples 59 and 60 respectively for the opening end-of-travel and closure end-of-travel. The nipples 59 and 60 are slidable in oblong openings 61 and 62 in two bracing plates 63 and 64. The abutment fingers 52 and 54 on the one hand and 53 and 55 on the other, slide respectively in longitudinal slots 65 and 64. The driving frame 57 is subjected to a displacement movement in the direction of the arrow F by means of a jack 70.

A rapid description of the method of operation of this valve in the position shown in the drawing will now be given. The valve 51 is in the open position, that is to say the closure plates 48 and 49 have their orifices 50 and 51 respectively in coincidence with the passages 43 and 44 in the walls 41 and 42. In this position, the stop fingers 52 to 55 have come into abutment against the bracing plates 63 and 64, and the ramps 56 on the frame 57 have permitted the closure plates 48 and 49 to move away against the action of the springs 48 so as to apply them against the internal faces of the walls 41 and 42.

When it is desired to carry out the closure, the jack 70 moves the driving frame 57 in a direction opposite to that of the arrow F. In a first part of this movement, the stop fingers 52 to 55 are freed from the separation effect due to the ramps 56 and approach each other, which permits the closure plates 48 and 49 to move away from the internal faces of the walls 41 and 42. Thereafter, the driving frame 57 moves with all the plates forming a unitary moving system. As the driving frame 57 approaches the fully closed position, the nipples 52 to 55 first come into abutment against the extremity of the slots 55 and 56, which ensures the stopping of these closure plates, while the driving frame 57 continues its movement. This has the effect of again separating the closure plates 48 and 49 from each other by the ramps 56 of the driving frame 57, until this driving frame comes into closure end-of-travel abutment by the nipples 59 at the extremities of the grooves 62.

Other important improvements are to be noted in this valve;

On the one hand, the two closure plates 48 and 49 each are provided with interconnecting skirts 74 and 75, which pass into oppositely disposed grooves in the closure plates. This assembly of skirts 74 and 75 forms a protection against projections of metal which will certainly take place in the direction of the valve, which represents the delicate member of the assembly comprising the continuous low pressure chamber and the working chamber.

On the other hand, it is seen that the closure plate 49 located adjacent the low pressure chamber, has an orifice 71 which, in the open position of the valve, comes into coincidence with an orifice 72 in the wall 42. This pair of orifices 71 and 72, when the valve 5 is put in the open position, insures effective exhaustion by the chamber 2 of the annular portion of the valve body situated outside the skirts 74 and 75, which otherwise would not fail to interfere considerably with the speed of vacuum production required in the working chamber 6.

In addition, it is noted that in the working wall 41 there has been formed a certain number of bowl-shaped clearances 76 and 77 which collect any particles which have been able to slip into the annular zone of the valve body, for example particles of projections of metal which reach this zone in spite of the presence of the protecting skirts 74 and 75.

The machine for welding by electron bombardment which has just been described is more particularly applicable to the mass production welding of parts, whether by axial welding, radial welding or a combination of these two methods of welding.

What we claim is:

1. A machine for welding by electron bombardment which comprises an electron gun for emitting an electron beam, a chamber under continuous partial vacuum in position to receive said electron beam, a working chamber, valve means for interconnecting said partial vacuum chamber and said working chamber, displacement means acting in the same direction throughout its path and substantially perpendicular to said electron beam for supporting said working chamber, means for continuously holding said electron gun under high vacuum, and narrow orifice means communicating with said partial vacuum chamber for the passage of said electronic beam thereto, said displacement means being further adapted to act in a direction substantially parallel to said electron beam and being independently adjustable in each of said directions.

2. A machine for welding by electron bombardment as claimed in claim 1, in which said displacement means comprises a first trolley and a second trolley slidably mounted on said first trolley, said second trolley being movable in a direction at right angles to that of said first trolley.

3. A machine for welding by electron bombardment as claimed in claim 2, in which the movement of said first trolley is effected along a direction perpendicular to the electron beam, while the movement of said second trolley is effected in a direction parallel to said electron beam.

4. A maching for welding by electron bombardment as claimed in claim 2, which further comprises a support for said working chamber, said support being pivotally mounted on said first trolley along a pivotal axis perpendicular to the two directions of movement of said first and second trolleys.

5. A machine for welding by electron bombardment as claimed in claim 4, in which said chamber support includes a moving poppet having a mandrel portion in position to pass into said working chamber.

6. A machine for welding by electron bombardment as claimed in claim 5, in which said working chamber includes a pair of oppositely disposed walls, one of said walls being traversed by the mandrel portion of said moving poppet and the other wall forming a door in said working chamber, and a tail-stock on the internal face of said door.

7. A machine for welding by electron bombardment as claimed in claim 1, which further comprises a supporting bracket on said partial vacuum chamber for said electron gun said working chamber being connected in a fluid-tight manner by said valve means to said partial vacuum chamber.

8. A maching for welding by electron bombardment as claimed in claim 7, in which said electron gun is supported above said partial vacuum chamber while the working chamber is supported underneath said partial vacuum chamber.

9. A machine for welding by electron bombardment as claimed in claim 1, in which said valve means comprises a valve body having a pair of orifices, two closure plates slidably carried by said valve body in respective juxtaposition with said orifices, said closure plates being mounted for sliding movement relative to the valve body from an open position exposing said orifices to a closed position blocking the same, and transfer means for bringing said closure plates toward each other during the transfer from said open position to said closed position.

10. A machine for welding by electron bombardment as claimed in claim 9, in which each of said closure plates includes an abutment, and said transfer means comprises a driving frame having a pair of ramps respectively adapted to co-operate with said abutments, and a jack for moving said driving frame relative to said abutments.

11. A machine for welding by electron bombardment as claimed in claim 10, in which said valve body is provided with valve-casing stops, and said driving frame is provided with finger stops co-operating with said valve-casing stops to define the closed position of said closure plates.

12. A machine for welding by electron bombardment as claimed in claim 11, in which said valve body is provided with additional valve-casing stops, and said driving frame is provided with additional finger stops co-operating with said additional valve-casing stops to define the open position of said closure plates.

13. A machine for welding by electron bombardment as claimed in claim 9, in which said closure plates are provided with openings in line, in the open position of said plates.

14. A machine for welding by electron bombardment as claimed in claim 13, in which said valve means includes protecting skirts extending from one of said closure-plates in the direction of the other closure-plate.

15. A machine for welding by electron bombardment as claimed in claim 14, in which of said valve-casing is provided with two blind grooves.

16. A machine for welding by electron bombardment as claimed in claim 13, in which the valve body is provided with an additional orifice adjacent the partial vacuum chamber.

17. A method of welding by electron bombardment, which comprises mounting parts to be welded within a working chamber, passing an electron beam through a chamber under continuous partial vacuum and then into said working chamber to weld said parts, moving said working chamber away from said partial vacuum chamber in a linear direction substantially perpendicular to said electron beam, pivoting said working chamber about an axis perpendicular to said linear direction, and then bringing back said working chamber in said linear direction toward said partial vacuum chamber.

18. A method of welding by electron bombardment, which comprises mounting parts to be welded in a first working chamber, passing an electron beam through a chamber under continuous partial vacuum and then into said working chamber to weld said parts, moving said first working chamber away from said partial vacuum chamber in a first direction along a straight line path substantially perpendicular to said electron beam, moving said filter working chamber in a second direction substantially parallel to said electron beam, substituting a second working chamber containing additional parts to be welded for said first working chamber, and thereafter moving said second working chamber toward said partial vacuum chamber.

19. A method of welding by electron bombardment, which comprises mounting parts to be welded in a first working chamber, passing an electron beam through a chamber under continuous partial vacuum and then into said working chamber to weld said parts, moving said first working chamber away from said partial vacuum chamber in a first linear direction substantially perpendicular to said electron beam, pivoting said working chamber about an axis perpendicular to said first linear direction, moving said first working chamber in a second linear direction substantially parallel to said electron beam, substituting a second working chamber containing additional parts to be welded for said first working chamber, and thereafter moving said second working chamber toward said partial vacuum chamber.

* * * * *